(12) United States Patent
Leskowitz

(10) Patent No.: US 12,313,713 B2
(45) Date of Patent: May 27, 2025

(54) METHODS AND SYSTEMS FOR ACQUIRING MAGNETIC RESONANCE DATA FROM A SAMPLE

(71) Applicant: NANALYSIS CORP., Calgary (CA)

(72) Inventor: Garett M. Leskowitz, Calgary (CA)

(73) Assignee: NANALYSIS CORP., Calgary (CA)

( * ) Notice: Subject to any disclaimer, the term of this patent is extended or adjusted under 35 U.S.C. 154(b) by 68 days.

(21) Appl. No.: 17/997,096

(22) PCT Filed: Apr. 27, 2021

(86) PCT No.: PCT/CA2021/050577
§ 371 (c)(1),
(2) Date: Oct. 25, 2022

(87) PCT Pub. No.: WO2021/217254
PCT Pub. Date: Nov. 4, 2021

(65) Prior Publication Data
US 2023/0168323 A1      Jun. 1, 2023

Related U.S. Application Data

(60) Provisional application No. 63/016,264, filed on Apr. 27, 2020.

(51) Int. Cl.
*G01R 33/46*      (2006.01)
*G01N 24/08*      (2006.01)

(52) U.S. Cl.
CPC ......... *G01R 33/4616* (2013.01); *G01N 24/08* (2013.01)

(58) Field of Classification Search
CPC ..................... G01R 33/4616; G01N 24/08
See application file for complete search history.

(56) References Cited

U.S. PATENT DOCUMENTS

| | | | |
|---|---|---|---|
| 5,162,734 A | 11/1992 | Rapoport | |
| 5,825,185 A * | 10/1998 | Liu .................. | G01R 33/56554 324/309 |
| 6,404,197 B1 | 6/2002 | Anderson et al. | |
| 8,380,445 B2 | 2/2013 | Raftery et al. | |
| 2014/0225614 A1 | 8/2014 | Prado | |

(Continued)

OTHER PUBLICATIONS

International Search Report and Written Opinion of PCT/CA2021/050577, Jul. 20, 2021, 9 pages.

(Continued)

*Primary Examiner* — Gregory H Curran
(74) *Attorney, Agent, or Firm* — Merchant & Gould P.C.

(57) ABSTRACT

The present document describes methods and systems for exciting magnetic resonance in a sample using trains of pulsed, oscillating magnetic fields that are modulated in their phase and amplitude according to a source waveform derived from the known or estimated magnetic response of a sample. Also disclosed are methods and systems for acquiring a response signal from the sample wherein data acquisition events are synchronized or interleaved with said modulated pulse trains. Further disclosed are methods and systems for identifying one or more of the presence, absence, amount, and concentration of a target substance in a sample. Also disclosed is a magnetic resonance device which uses such pulse trains and synchronized acquisition to improve the selectivity of magnetic resonance data.

21 Claims, 6 Drawing Sheets

(56) References Cited

U.S. PATENT DOCUMENTS

| | | | |
|---|---|---|---|
| 2016/0109613 A1 | 4/2016 | Paulsen et al. | |
| 2019/0361080 A1* | 11/2019 | Nittka | G01R 33/5608 |
| 2020/0011816 A1 | 1/2020 | Telfah et al. | |
| 2022/0252516 A1* | 8/2022 | Smith | G01N 21/65 |

OTHER PUBLICATIONS

Extended European Search Report received from the European Patent Office dated May 7, 2024 for European Application No. EP21795356.

* cited by examiner

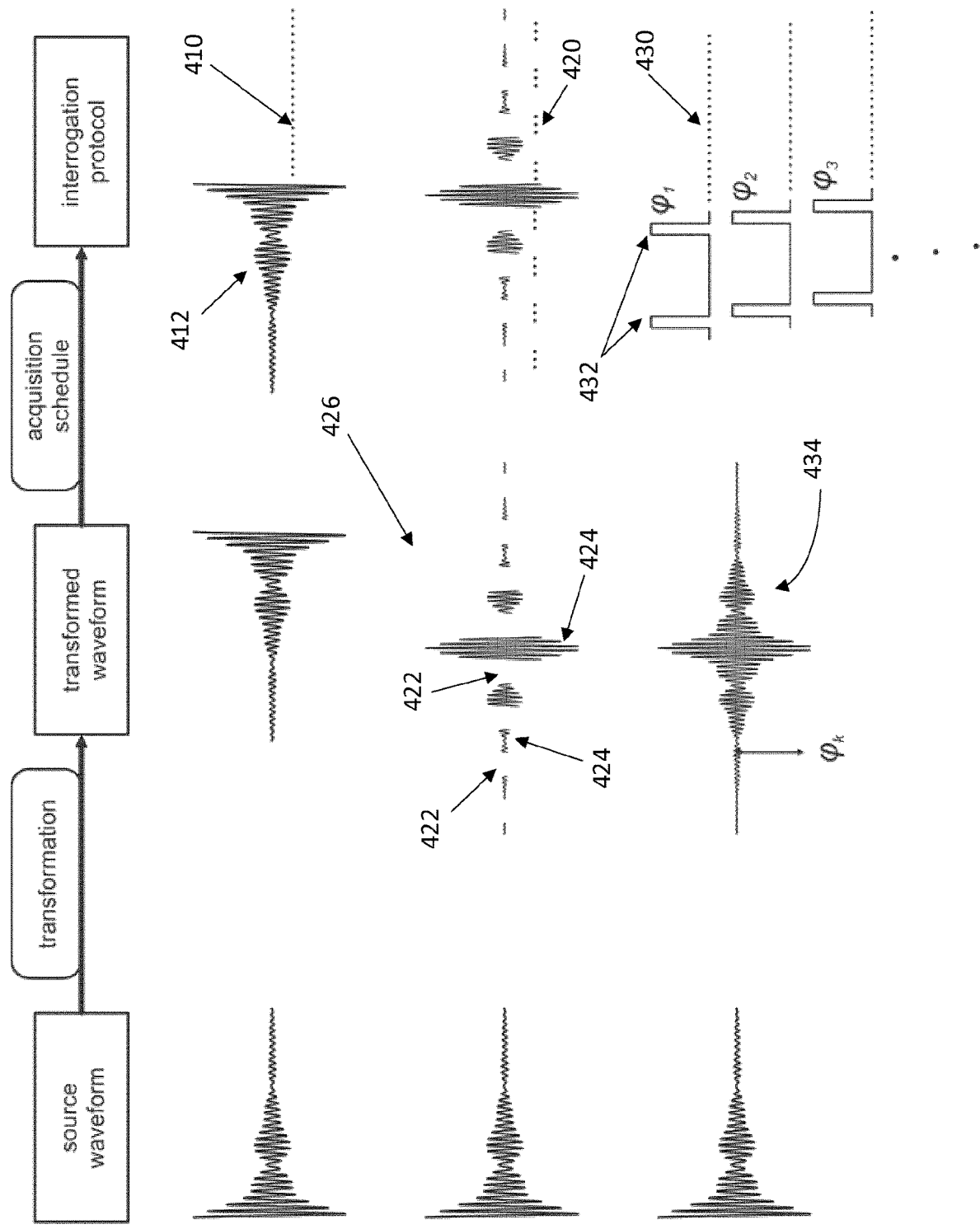

METHODS AND SYSTEMS FOR ACQUIRING MAGNETIC RESONANCE DATA FROM A SAMPLE

BACKGROUND (a) Field

The subject matter disclosed generally relates to methods and systems for acquiring magnetic resonance data from a sample.

(b) Related Prior Art

Many industrial processes require the ability to frequently and accurately analyze the content and purity of chemical samples to produce saleable products and services. For example, such processes include, but are not limited to, chemical synthesis, reaction monitoring, drug discovery, development of new materials, oil & gas production, mining & metal extraction, food & health product authentication, and identification & control of harmful substances (e.g., narcotics).

Often, such processes produce or involve the analysis of chemical samples containing more than one chemical component (e.g., a reaction in progress may be monitored to determine when the reaction has reached maximum product yield or a food product may be tested for quality to ensure that the desired product has not been adulterated with additional unexpected and/or harmful components).

Numerous attempts have been made to provide such analysis, and some of these analyses include methods associated with nuclear magnetic resonance (NMR) technology. In particular, some methods of magnetic resonance include frequency-selective pulses.

For example, U.S. Pat. No. 6,404,197 describes a spectral editing method and selective excitation in glucose detection. The spectral editing is achieved using an NMR "double-quantum filter".

U.S. Pat. No. 8,380,445 describes a system that involves selective pulses and TOCSY mixing, with optimization of pulses and multivariate statistical analysis.

A type of frequency selective pulse is also used in ion cyclotron resonance (ICR) technology. In ion cyclotron resonance (ICR), ions are trapped at very low pressure in a sealed container using a substantially uniform static magnetic field and electric fields. The ions undergo a circular motion, called cyclotron motion, in a plane perpendicular to the magnetic field direction. Cyclotron motion can be detected as a voltage that is induced in nearby capacitor plates by the moving ions. The frequency of the signal that is detected is characteristic of the mass-to-charge ratio of the corresponding ion, and so ICR can be used as a method of mass spectrometry. The amplitude of the circular cyclotron motion of a particular population of ions can be increased or decreased by applying a voltage to the capacitor plates at the characteristic frequency of the ions.

One method used in ICR is called the stored-waveform inverse Fourier transform ("SWIFT") method. (R. B. Cody, R. E. Hein, S. D. Goodman, and Alan G. Marshall, "*Stored waveform inverse Fourier transform excitation for obtaining increased parent ion selectivity in collisionally activated dissociation: Preliminary results*", *Rapid Communications in Mass Spectrometry*, vol 1, no 6, 1987", and "Shenheng Guan and A. G. Marshall, "*Stored waveform inverse Fourier transform (SWIFT) ion excitation in trapped-ion mass spectrometry: Theory and applications*", *International Journal of Mass Spectrometry and Ion Processes*, Vol 157-158, P 5-37, 1996".)

In SWIFT excitation, an inverse Fourier transformation of a region of a spectrum is used as a voltage waveform. The voltage waveform is applied as a voltage to the capacitor plates in an ion trap to excite ion cyclotron resonance. This can be used to selectively purge a trap of undesired ions or to excite ions for collision with a background gas to study chemical processes involving the ions.

Some work has been done to modify the originally derived SWIFT waveform using phase modulation techniques, for the purpose of reducing the total energy or maximum voltage required.

In NMR, a wide range of frequency-selective pulses can be used for selective excitation or for other applications, such as solvent signal suppression. These methods are straightforward when a single resonance frequency or band is the target of excitation or suppression but can be far more challenging when the target frequency profile is more complex. Therefore, there remains a need in the art for methods and systems that allow for accurate chemically selective excitation especially in the analysis of the content and purity of samples.

SUMMARY

The present embodiments provide such methods and systems.

According to one aspect of the invention, there is provided a method for selectively exciting magnetic resonance from one or more components in a sample containing a mixture of components using an excitation profile derived from a known or estimated response function characteristic of at least one of said components.

Disclosed are embodiments which apply nuclear magnetic resonance (NMR) spectroscopy to a chemical sample to elucidate the molecular structure(s) of one or more different chemical components in the sample. In accordance with the disclosed embodiments, NMR can also be used to quantify components in multicomponent mixtures. The disclosed embodiments apply NMR spectroscopy and NMR devices (also called spectrometers) to provide information about the type, number, and connectivity of different moieties (parts) within the molecules of the one or more different chemical components.

In nuclear magnetic resonance (NMR) systems in accordance with an embodiment, a sample is exposed to magnetic fields, which may include static, largely time-independent fields and oscillating, time-dependent or pulsed fields. A magnetic response of the sample to pulsed fields is measured by a detection apparatus, typically comprising a coil placed near or around the sample, a preamplifier, and electronic circuitry for filtering, demodulating, and digitizing the response signal from the sample. The measured response of the sample to application of these magnetic fields may be characteristic of the chemical or physical nature of the sample, and in particular to the local environment of nuclear spins within the sample, and so NMR finds application in chemical analysis, materials science, biological science, and medical imaging.

During an NMR experiment for chemical analysis in accordance with the present embodiments, a sample is immersed in a very strong, highly uniform static magnetic field, allowed to come to magnetic equilibrium, and then exposed to a sequence of one or more strong brief pulses of oscillatory magnetic field. In embodiments, the strength of the magnetic field is typically in the range 0.5 to 30 tesla but may be less than or greater than this range depending on the application. Exemplary, but non-limiting, applications include benchtop NMR spectrometry (0.5-3.0 tesla) and mid-field and high-field NMR spectrometry (2.5-30 tesla), and may also include magnetic resonance imaging (0.5-9.0 tesla). Magnets used in applications may include permanent magnets, or arrays thereof, or superconducting magnets, or a combination thereof. If the oscillation frequency of the pulses is near the frequencies of free Larmor precession of nuclear spins in the sample, then this pulse train can induce a coherent, oscillatory magnetic response in the sample. The response to said pulses is then recorded and mathematically analyzed. This response is referred to as a transient response function which typically takes the form of a time series of real, complex, or hyper-complex values comprising oscillatory signals decaying or otherwise modulated in amplitude, or a set of such time-series. Examples of transient response functions include a free-induction decay (FID), a spin echo, a solid echo, a stimulated echo, a "perfect echo" (a term of art, e.g. see Morris, cited below), an adiabatic half-passage, or other types, depending upon the pulse sequence used to excite the transient response. Typically, the pulses can be strong enough so that magnetic spins within a relatively broad frequency bandwidth are excited to precession, or the pulses may be lower in amplitude and longer in duration so that a relatively narrow range of frequencies are excited. In the latter case, the excitation of the spins in the sample is said to be "selective." The pulse train used for excitation may also include pulses that are swept in frequency over the bandwidth.

In NMR, a shaped pulse is a kind of phase-and-amplitude modulated radiofrequency pulse in which a carrier wave at a carrier frequency is modulated in its phase and/or amplitude before being applied to a sample. The modulation may be accomplished with electronics, and the electronics may include a signal processing system such as a microprocessor or field-programmable gate array (FPGA) unit. If the modulation is merely to turn the carrier on for a brief time and then off again after a time that is typically on the order of a few microseconds, the pulse is called a "hard" pulse.

According to an aspect, there is provided method of acquiring magnetic resonance data from a sample, the method comprising:
a. placing the sample in a static magnetic field;
b. obtaining a source waveform that is representative of a transient response function of a target substance that is suspected to exist in the sample;
c. exciting spin coherence in the sample, the exciting comprising:
  constructing a pulse train comprising one or more shaped pulses by mathematically transforming said source waveform;
  augmenting said pulse train with a data-acquisition schedule that is synchronized with said pulse train; and
  applying the augmented pulse train to the sample;
d. detecting and recording one or more responses of the sample according to said data-acquisition schedule synchronized with said pulse train; and
e. composing said one or more responses into a first magnetic resonance data set.

According to an embodiment, said transient response function comprises one or more of: a free induction decay, a spin echo, a solid echo, a stimulated echo, a "perfect echo", and an adiabatic half passage.

According to an embodiment, there is further provided the step of identifying one or more of: presence, absence, amount, and concentration of the target substance in the sample.

According to an embodiment, said source waveform is obtained by measuring a spectrum or a transient response function using a magnetic resonance device.

According to an embodiment, said source waveform is obtained by a simulation.

According to an embodiment, said source waveform is obtained by lookup from within a spectral library.

According to an embodiment, said mathematically transforming comprises one or more of: a Fourier transformation; an inverse Fourier transformation; a time-reversal; complex conjugation; multiplication by an envelope function; replication of parts of said source waveform; formation of an echo; modulation in frequency; modulation in phase; and modulation in amplitude.

According to an embodiment, said mathematically transforming further comprises adding a further transformed waveform to the source waveform.

According to an embodiment, said data-acquisition schedule comprises detection intervals interleaved between the pulses of said pulse train.

According to an embodiment, said detecting follows said pulse train and said pulse train comprises a pulse which is a time-reversed or echoed version of the complex conjugate of said source waveform.

According to an embodiment, there is further provided the step of composing a second magnetic resonance data set larger than the first magnetic resonance data set, wherein composing the second magnetic resonance data set comprises:
f. further transforming the said source waveform; or
g. further modifying the said pulse train;
h. repeating steps (a-g) to obtain a plurality of responses;
i. composing the plurality of responses obtained at step (h) into the second magnetic resonance data set.

According to an embodiment, wherein step (g) comprises modifying the phase of at least one pulse in the pulse train.

According to an embodiment, said data set comprises an NMR spectrum.

According to another aspect, there is provided a method comprising the step of selectively exciting magnetic resonance from one of multiple chemical components in a chemical mixture, the selectively exciting comprising applying, to a sample of the chemical mixture, a pulse sequence that is created by transforming a transient response function obtained from the one of the multiple chemical components.

According to an embodiment, the transient response function comprises one or more of: a free induction decay (FID), a spin echo, a solid echo, a stimulated echo, a "perfect echo," and an adiabatic half passage.

According to an embodiment, there is further provided the step of obtaining an NMR spectrum of the one of the multiple chemical components after selectively exciting magnetic resonance from the one of the multiple chemical components.

According to another aspect, there is provided a device for implementing the methods as described above.

According to a further aspect, there is provided a device for acquiring magnetic resonance data, the device comprising: a main field magnet system for producing a static magnetic field, the magnet system at least partially enclosing a sample region shaped and dimensioned to receive a sample therein; a coil for delivering a pulsed magnetic field to the sample and for receiving the response of the sample to the pulsed magnetic field; and control circuitry operably connected to the coil for controlling the pulsed magnetic field and detecting and recording the response of the sample to the pulsed magnetic field. The control circuitry being adapted to: obtain a source waveform that is representative of a transient response function of a target substance that is suspected to exist in the sample; excite spin coherence in the sample, the exciting comprising: constructing a pulse train comprising one or more shaped pulses by mathematically transforming said source waveform; augmenting said pulse train with a data-acquisition schedule that is synchronized with said pulse train; and applying the augmented pulse train to the sample. The control being also adapted to detect and record one or more responses of the sample according to said data-acquisition schedule synchronized with said pulse train; and compose said one or more responses into a first magnetic resonance data set.

According to an embodiment, the transient response function comprises one or more of: a free induction decay (FID), a spin echo, a solid echo, a stimulated echo, a "perfect echo," and an adiabatic half passage.

According to an embodiment, the device is further adapted to identify one or more of: presence, absence, amount, and concentration of the target substance in the sample.

According to a further aspect, there is provided a method of acquiring magnetic resonance data by stimulating/exciting (producing) spin coherence in a sample which may contain magnetic spins, the method comprising: placing the sample in a static magnetic field; obtaining a source waveform that is characteristic (or representative) of the NMR response (for example, in one embodiment, a free-induction decay) of a target substance that is suspected to exist in the sample; constructing a pulse train of one or more shaped pulses by mathematically transforming said source waveform; augmenting said pulse train with a data-acquisition schedule that is synchronized with said pulse train; detecting and recording one or more responses of the sample according to said data-acquisition schedule synchronized with said pulse train; and composing said responses into a magnetic resonance data set.

In an embodiment, the source waveform is obtained by measurement of a spectrum on a magnetic resonance device. In another embodiment, the source waveform is obtained by a simulation software program. In a further embodiment, the source waveform is obtained by lookup from within a spectral library.

In an embodiment, the mathematical transformation comprises one of: a Fourier transformation; an inverse Fourier transformation; a time-reversal; complex conjugation; multiplication by an envelope function; replication of parts of said source waveform; formation of an echo; modulation in frequency; modulation in phase; and modulation in amplitude.

In an embodiment, the time schedule comprises detection intervals interleaved between the pulses of said pulse train.

In an embodiment, the detection follows said pulse train and said pulse train comprises a pulse which is a time-reversed or echoed version of the complex conjugate of said source waveform.

In an embodiment, the said data set comprises an NMR spectrum.

In an embodiment, said data set comprises a multidimensional NMR spectrum.

In an embodiment, there is provided means to capture a magnetic response to said excitation.

According to another aspect, there is provided individual magnetic field pulses within a train or sequence of pulses that are modulated in their phase and amplitude according to a waveform derived by transforming a known or estimated response function that is characteristic of the response of a sample to various standard excitation methods.

In an embodiment, the magnetic response to said excitation may be recorded during periods that follow an applied pulse or pulse trains or that are synchronized or interleaved with the applied pulse trains.

In accordance with another aspect, there is provided a method of selectively exciting magnetic resonance from one of multiple chemical components in a chemical mixture by applying, to a sample of the chemical mixture, a pulse sequence that is created by transforming a transient response function such as a free-induction decay (FID), or a spin echo, or a solid echo, a stimulated echo, a "perfect echo", or an adiabatic half-passage obtained from the one of the multiple chemical components. (*Perfect Echo is a term of art.* See for example: K. Takegoshi, K. Ogura, and K. Hikichi, "*A perfect spin echo in a weakly homonuclear J-coupled two spin-½ system,*" Journal of Magnetic Resonance, vol 84, p. 611-615 (1989), or J. A. Aguilar, M. Nilsson, G. Bodenhausen, and G. A. Morris, "*Spin echo NMR spectra without J modulation,*" Chemical Communication vol 48, p 811-813 (2012).)

In an embodiment, the method further comprises obtaining an NMR spectrum of the one of the multiple chemical components after selectively exciting magnetic resonance from the one of the multiple chemical components.

In accordance with a further aspect, there is provided a method of selectively stimulating, and acquiring data from, one of multiple chemical components in a chemical mixture by applying, to a sample of the chemical mixture, a pulse sequence that is created by transforming a transient response function characteristic of an NMR analysis of the one chemical component.

In an embodiment, selectively stimulating the sample comprises exciting the sample with the pulse sequence.

DEFINITION OF TERMS

The following terms are defined below.

Source waveform: A time series of real-valued, complex-valued, or hyper-complex-valued data. In embodiments, the time series is characteristic (or representative) of the transient response function or NMR signal associated with a chemical component or substance or of a part of said component or substance.

Transient response function: a response to magnetic field pulse(s) applied to a sample. The transient response function may take the form of a time series of real, complex, or hyper-complex values comprising oscillatory signals decaying or otherwise modulated in amplitude. In embodiments, examples of a transient response function include but are not limited to a free-induction decay (FID), a spin echo, a solid echo, a stimulated echo, a "perfect echo", or an adiabatic half-passage, or other types, depending upon the pulse sequence used to excite the transient response.

In the present embodiments, a transient response function may be a characteristic of a combination of three elements: 1) a target substance and associated chemical conditions (e.g. pH or temperature); 2) a particular pulse sequence that is applied, and 3) the nature of the static magnetic field to which the sample is exposed, and in particular, the strength of the field. Therefore, in this disclosure, references to a transient response functions being "characteristic" or "representative" of a particular substance or of a "particular substance within a sample under the influence of a static magnetic field to which the sample is exposed" mean a transient response function under ranges of such specified conditions that are suitable for a particular application.

Transformed waveform: A time series of real-valued, complex-valued, or hyper-complex-valued data. In embodiments, the time series is derived from a source waveform through any of several mathematical transformations. In embodiments, a transformed waveform is used as a shaped pulse or pulse train.

Data-acquisition schedule: A set of time points at which magnetic resonance data is to be sampled from a magnetic resonance detector. The time points are selected with reference to the times defining data samples in a transformed waveform.

Interrogation protocol: A set of transformed waveforms in combination with a prescription for acquiring data, which is synchronized with said transformed waveforms.

Data set: A set of one of more time series of real-valued, complex-valued, or hyper-complex-valued data points recorded during a magnetic resonance experiment. Non-limiting examples of a magnetic resonance data set are 1-dimensional or multidimensional NMR spectra.

Magnetic spin: The intrinsic angular momentum of a body such as a nucleus or an electron.

Spin coherence: A non-equilibrium state of the magnetic spin system of a sample. In some cases, spin coherence gives rise to a time-dependent magnetic response in a detector.

Time-suspension sequences: this is a term of art which is described for example in D. G. Cory, J. B. Miller, and A. N. Garroway, "Time-suspension multiple-pulse sequences: applications to solid-state imaging," Journal of Magnetic Resonance, vol 90, p 205-213 (1990). Time-suspension pulse sequences can be used to selectively suppress certain physical interactions affecting a spin system.

POWER NMR: A particular method of time suspension described, for example, in J. G. Kempf and D. P. Weitekamp, "Method of atomic-layer-resolved measurement of polarization fields by nuclear magnetic resonance," Journal of Vacuum Science and Technology B: Microelectronics and Nanometer Structures Processing, Measurement, and Phenomena vol 18, p. 255 (2000).

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which:

FIGS. 4A-4C show a source waveform transformed in three different ways according to embodiments, with inserted time points at which data is captured, wherein:

FIG. 4A shows an embodiment in which a complex conjugate of a source waveform is time-reversed, and signal detection follows the time-reversed shaped pulse, in accordance with an embodiment.

FIG. 4B shows an embodiment in which a source waveform is prepended with a time-reversed complex conjugate of the source waveform, the resulting waveform is suppressed in amplitude at regular intervals, and data acquisition points are inserted into the shaped pulse during the resulting gaps, in accordance with an embodiment.

FIG. 4C shows an embodiment in which a source waveform is transformed by prepending it with a time-reversed complex conjugate of the source waveform, and the phase of a second pulse in each iteration of a two-dimensional (2D) data acquisition protocol is selected according to phases of sequential, selected points in the transformed waveform, in accordance with an embodiment.

It will be noted that throughout the appended drawings, like features are identified by like reference numerals.

DETAILED DESCRIPTION

The present document describes methods and systems for exciting (producing) magnetic resonance in a sample using trains of pulsed, oscillating magnetic fields that are modulated in their phase and amplitude according to a source waveform derived from the known or estimated magnetic response of a suspected or possible component in the sample. Also disclosed are methods and systems for acquiring a response signal from the sample wherein data acquisition events are synchronized or interleaved with said modulated pulse trains. Also disclosed is a magnetic resonance apparatus which uses such pulse trains and synchronized acquisition to improve the selectivity of magnetic resonance data.

Disclosed herein are methods, systems and apparatuses comprising a magnetic resonance spectrometer system operatively connected to a processor/processing unit which is adapted to construct and deliver a train of modulated pulses to a sample according to a method described herein and to record magnetic resonance data in the form of time series of values, with said recording synchronized with the pulse train.

In an embodiment, there is described a device for acquiring magnetic resonance data from/for a sample. The device comprises a sample region shaped and dimensioned to receive a sample (for example in a sample tube), and a coil for delivering a pulsed or time-varying magnetic field to the sample. The device further comprises a main magnet array or assembly or main field magnet system for subjecting a sample to a static magnetic field. Delivering the pulsed magnetic field to the sample may also mean subjecting the sample to the magnetic field or exciting the sample with the magnetic field. Subjecting the sample may also mean placing the sample under the influence of the magnetic field, etc. The coil is also for receiving the response of the sample to the magnetic field. The device also comprises control circuitry operably connected to the coil for controlling the magnetic field and detecting and recording the response of the sample to the magnetic field for acquiring the magnetic resonance data for the sample.

For the avoidance of doubt, the static magnetic field and the pulsed magnetic field are distinct from each other. In a non-limiting example, the static magnetic field is generated using an assembly of permanent magnets while the pulsed magnetic field is generated using a system comprising a control circuitry operably connected to a coil, the coil being configured for delivering the pulsed magnetic field to the sample and receiving the response therefrom.

Figure 1:
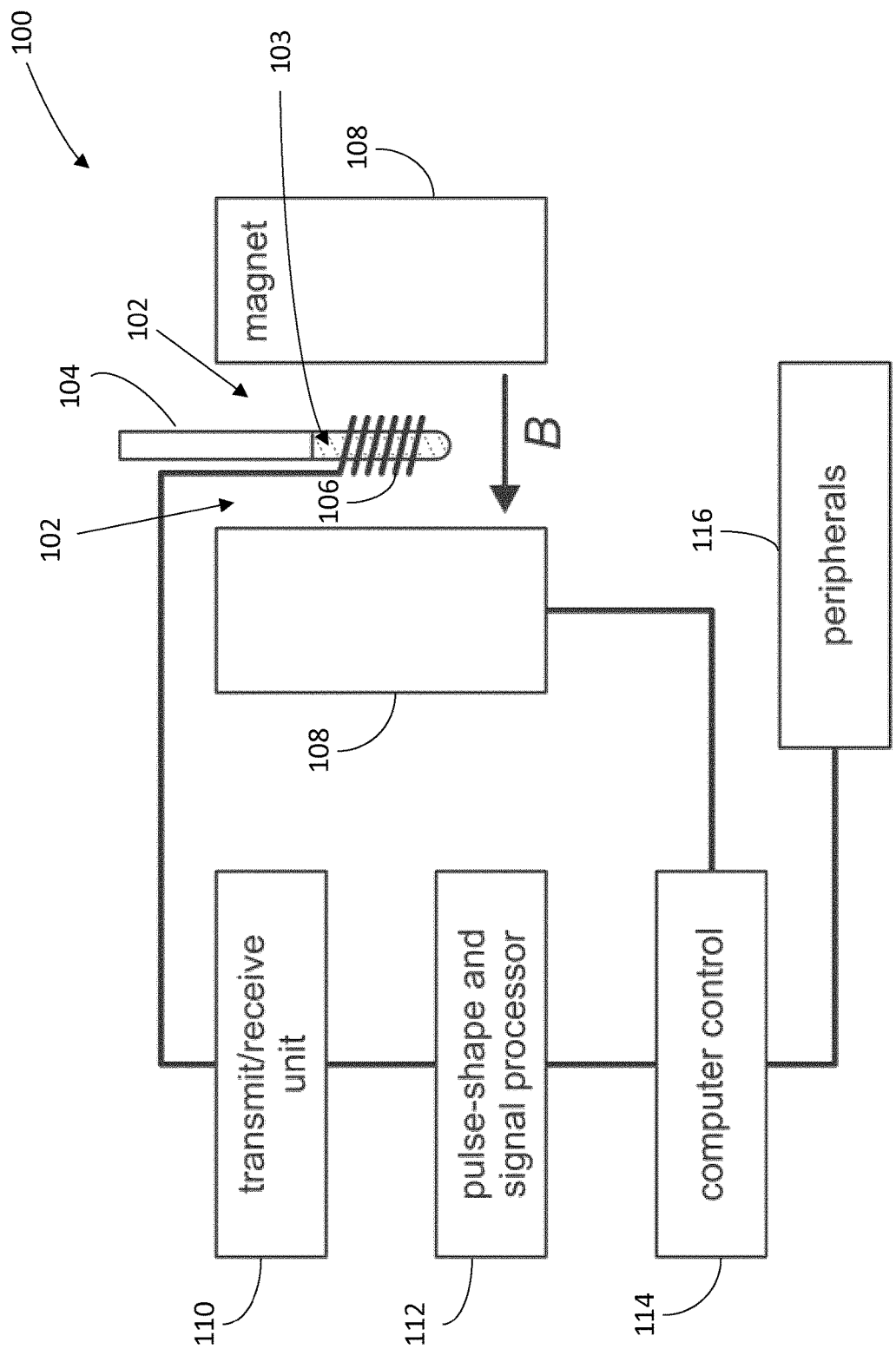
FIG. 1 is a block diagram of a magnetic resonance spectrometer system, in accordance with an embodiment.

A non-limiting example of such device may include an NMR spectrometer system/device as illustrated in FIG. 1. It should be noted that some of components described and shown may be optional, and some may be combined or embedded in a single unit/component/module. It should also be noted some of the modules may be implemented using hardware, software, or a combination thereof.

Referring now to the drawings, and more particularly to FIG. 1, there is illustrated a block diagram of a magnetic resonance spectrometer system, in accordance with an embodiment of the invention.

FIG. 1 shows schematically the main components of an NMR spectrometer system, in accordance with an embodiment. The NMR spectrometer 100 system comprises
  a. A sample region 102 shaped and dimensioned to receive a sample tube 104, the sample tube for receiving a sample 103 therein;
  b. A coil 106 for delivering time-dependent (e.g., radiofrequency) or pulsed magnetic fields to the sample and for receiving a response signal therefrom;
  c. A main field magnet system 108;
  d. A transmit/receive unit 110, which may comprise radiofrequency (RF) power amplifiers, signal preamplifiers, switches, filters, frequency mixers, or the like;
  e. A pulse-shape and signal-processing unit 112 for modulating and timing pulsed output and for digitizing and processing the received signal;
  f. A computer control system 114; and
  g. Peripheral devices 116, such as keyboards, printers, display screens, file storage systems, or connections to networks.

In embodiments, the spectrometer system 100 as a whole may also comprise means for spinning the sample, flowing the sample through a sample volume, maintaining the sample at a controlled temperature profile, or subjecting the sample to other forms of excitation or stimuli, such as electromagnetic waves, including microwaves or ultraviolet, visible, or infrared light, or to acoustic (sound) waves. The main field magnet system may comprise component magnets made of remanent magnetic materials, pole pieces, resistive field coils, superconducting coils and associated cryogenic systems, shimming or field-homogenizing systems, magnetic shielding systems, or thermal control systems required to keep the magnet or the sample temporally stable or spatially uniform.

In embodiments, the pulse-shape and signal processing unit 112 is adapted to apply transformed source waveforms to the sample, to acquire transient response function signals such as free-induction decays or others noted herein, and to schedule signal detection events in synchrony with applied transformed source waveforms or pulse trains.

Method Overview

This application discloses methods for exciting magnetic resonance in a first sample using trains of pulsed, oscillating magnetic fields that are modulated in their phase and amplitude according to a function derived from the known or estimated magnetic response of a second sample. The first sample may comprise a mixture of multiple chemical components and the second sample may comprise one of the chemical components (this may be referred to as the target substance) comprised in the first sample. The first sample may be suspected to comprise the chemical component in the second sample. Applying the trains of pulsed, oscillating magnetic fields to the first sample may be used to determine either that the chemical component in the second sample is, or is not, comprised in the first sample. Through analysis of the magnetic resonance data output (e.g., in the form of an NMR spectrum) from the application of the trains of pulsed, oscillating magnetic fields to the first sample, this method may be used to identify within the first sample one or more of the presence, absence, amount, and concentration of the target substance.

In embodiments of the present disclosure, sample refers to an object under examination and may comprise chemical, biological, medical, electronic, or other materials. Also disclosed are methods for acquiring a response signal from the sample wherein data acquisition events are synchronized or interleaved with said modulated pulse trains. This application further discloses magnetic resonance apparatuses which use such pulse trains and synchronized acquisition to improve the selectivity of magnetic resonance data. For clarity, the second sample may include the chemical component in a pure form and may also include it along with other impurities.

Figure 2:
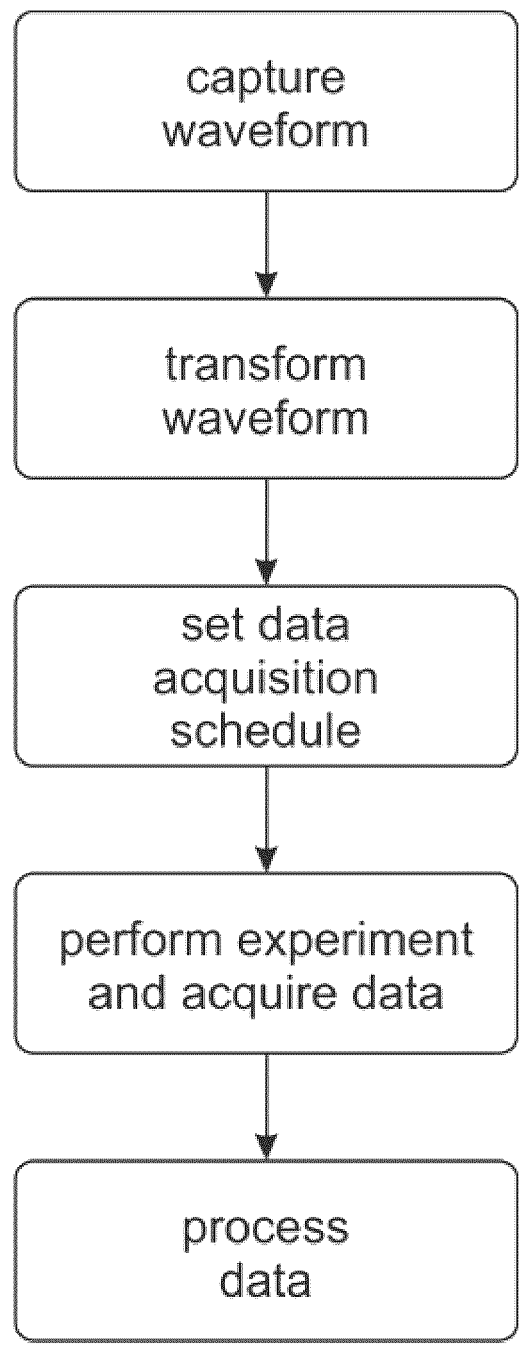
FIG. 2 is a flowchart of a method for exciting magnetic resonance in a sample, in accordance with an embodiment.

FIG. 2 is a flowchart of a method for exciting magnetic resonance in a sample in accordance with an embodiment of the present disclosure.

In embodiments of the present disclosure, a source waveform is captured from a source. This source waveform may be a transient response function such as an FID associated with a chemical substance of interest that may be present or may be suspected in a mixture. In embodiments, the source waveform may be characteristic of a chemical part (moiety) present in a chemical component or substance.

Waveform Sources

In embodiments, the source waveform may be a transient response function such as a free-induction decay (FID) obtained from a single hard pulse applied to a suitable sample via an NMR spectrometer. In embodiments, the source waveform may be obtained by measurement of a spectrum on a magnetic resonance device. Alternatively, the source waveform may be a simulated free-induction decay obtained through computer simulation based on the known or suspected chemical structure of a target compound using standard methods and software that are known to practitioners skilled in the art of nuclear magnetic resonance. Non-limiting examples of NMR simulation programs or systems are ACD Labs, Perch, Modgraph, NMRShiftDB, ChemNMR, Spinach, or SpinDynamica, and other programs and systems which are readily available and known to those skilled in the art.

The source waveform may also be a simulated free-induction decay from a portion of a target molecule comprising the resonances expected from selected moieties within a target molecule or from selected frequency ranges of the corresponding NMR spectrum. The source waveform may be obtained using a simulation software program.

Simulated or measured spectra may be stored in a library and recalled for use as needed. The source waveform may be obtained by recall (lookup) from within a spectral library. The spectra from a library may be combined by addition to yield a source waveform that is representative of a mixture of compounds, and this sum waveform may comprise individual free-induction decays that are multiplied by weighting coefficients to yield a weighted sum that is representative of a mixture with estimated concentrations.

In the foregoing discussion, the non-limiting example of a free-induction decay is assumed as the example of a transient response function. It will be appreciated that other forms of chemically specific transient response functions, such as spin echoes, solid echoes, stimulated echoes, "perfect echoes", or adiabatic half-passages may be used in place of FIDs as applications require.

As shown in FIG. 2, a captured source waveform may then be subjected to a mathematical transformation which renders it suitable as a selective pulse or pulse train. In embodiments, the source waveform may be subjected to a set of transformations to yield a set of transformed waveforms to be used in a sequence of experiments.

Waveform Transformations

Embodiments of the present disclosure may be realized by subjecting the source waveform to a filtering or transformation process. For example, and not by way of limitation, this filter may be a linear filter, may be a nonlinear filter, or may be realized by multiplying the signal waveform by an envelope (apodization) function or subjecting it to a decimation filter. The source waveform may be modified by "gating" it, that is, by setting selected series of values in the waveform to zero amplitude. This process introduces "gaps" or "windows" into the waveform during which other events may be inserted or "interleaved". In particular, signal detection may take place during these windows, and the overall data set will comprise short records of data that were captured during such windows.

Figure 3A:
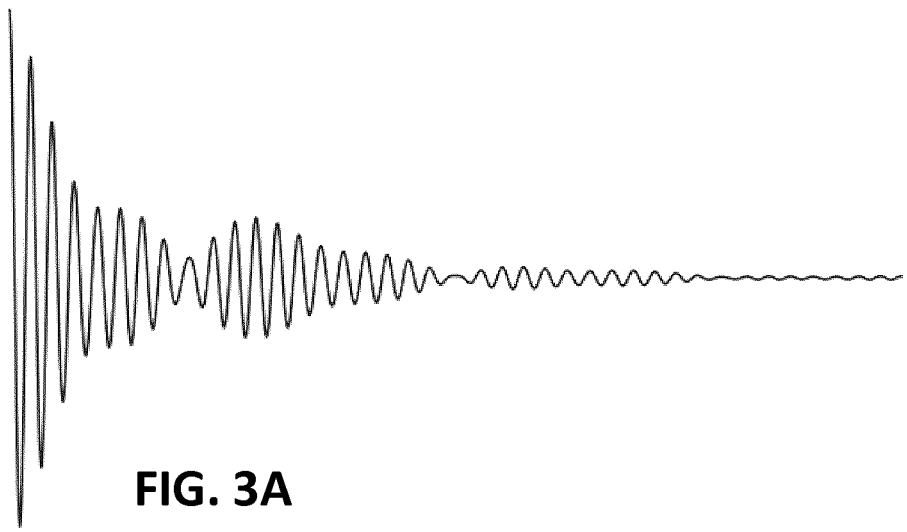
FIG. 3A shows the real part of a source waveform derived from an NMR free-induction decay in accordance with an embodiment.
Figure 3B:
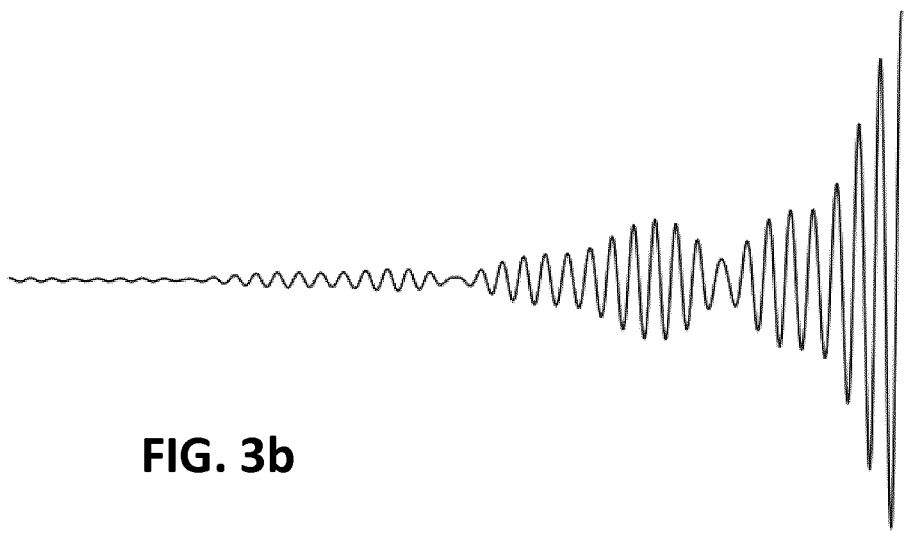
FIG. 3B shows the source waveform of FIG. 3A reversed in time in accordance with an embodiment.

The source waveform, such as the example source waveform shown in FIG. 3A, may be used as is or subjected to several types of useful transformations, including:

h. Time reversal: the individual values in the time series may be reordered last-to-first, as shown in FIG. 3B.
i. Complex conjugation: the complex conjugate may be taken of the individual complex values in the source waveform time-series.
j. Symmetrization in time: the source waveform may be prepended with a time-reversed copy of the waveform.
k. Antisymmetrization in time: the source waveform may be prepended with a time-reversed copy of the complex-conjugate waveform.
l. Frequency shift: the source waveform may be shifted in frequency or placed off-resonance.

The source waveform may be subjected to apodization, phase adjustment, or shifted in frequency. The time series of the waveform may be truncated or subjected to a decimation filter. The waveform may be "chirped" or modulated by a time-varying or sweeping shift in baseband frequency. In embodiments, a frequency-sweep transformation may be made to coincide with a sweep in the field during application of the pulse train in an experiment.

The source waveform may be gated or gapped, with times interleaved or interspersed in the time series where the waveform is set to zero amplitude. This also contemplates a waveform which is transformed by adding time periods in the waveform where the amplitude is zero.

Figure 3C:
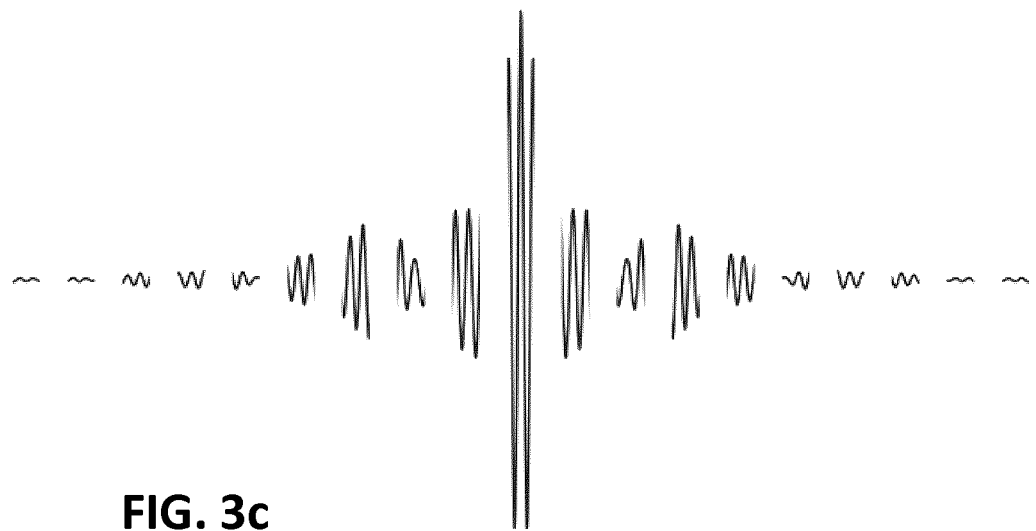
FIG. 3C shows a symmetrized extension of the source waveform of FIG. 3A wherein the extended waveform's amplitude is suppressed to zero during regularly spaced intervals in accordance with an embodiment.

One or more transformations may be combined with one or more other transformations. For example, and not by way of limitation, the source waveform may be time-reversed, complex-conjugated, apodized, and then gated. FIG. 3C shows a source waveform that has been modified in this manner.

In an embodiment of the present disclosure, the resulting transformed waveform may be used in a one-dimensional (1D) NMR experiment (for example, and not by way of limitation, $^1H$ or $^{13}C$ experiments). In a further embodiment, the transformed waveform may be further transformed by breaking the waveform up into individual pulses and applying the pulses in a pseudo-random noise encoding sequence or stochastic excitation sequence.

In another embodiment of the present disclosure, the resulting transformed waveform may be used to modulate the phase or amplitude of a pulse or pulses in a sequence that is subsequently used in a two-dimensional (2D) NMR experiment, for example, and not by way of limitation, as a correlation spectroscopy (COSY), Heteronuclear Single Quantum Coherence (HSQC) or Total Correlation Spectroscopy (TOCSY) experiment, or an NMR experiment of higher dimension.

In embodiments, the transformed waveform may be further transformed by adding it to a second pulse train. For example, and not by way of limitation, the transformed waveform may be inserted into the windows of a pre-existing multiple pulse sequence, including a line-narrowing sequence such as WAHUHA (Waugh, J. S., Huber, L. M., and Haeberlen, U., "Approach to high-resolution NMR in solids," Physical Review Letters 20, 180-183, 1968), CLSW (Cho, H. M., Lee, C. J., Shykind, D. N., and Weitekamp, D. P, "Nutation sequences for magnetic resonance imaging in solids," Physical Review Letters 55, 1923-1926, 1985), a "time-suspension" sequence (D. G. Cory, J. B. Miller, and A. N. Garroway, "Time-suspension multiple-pulse sequences: applications to solid-state imaging," Journal of Magnetic Resonance, vol 90, p 205-213 (1990)), a "POWER NMR" sequence, or a decoupling or spin-lock sequence. (POWER NMR is a term of art. See for example: J. G. Kempf and D. P. Weitekamp, *"Method of atomic-layer-resolved measurement of polarization fields by nuclear magnetic resonance," Journal of Vacuum Science and Technology B: Microelectronics and Nanometer Structures Processing, Measurement, and Phenomena* vol 18, p. 255 (2000)).

In a further embodiment, the transformed waveform may be further transformed by breaking the waveform up into individual pulses and subjecting the individual pulses to noise encoding. A non-limiting example of noise encoding has been published (T. Zhang and C. A. Michal, "Broadband NMR with random-window noise excitation," Journal of Magnetic Resonance, 297, 172-179, 2018).

Returning to FIG. 2, a suitably transformed waveform may then be augmented with a data-acquisition schedule whose data-capture events are synchronized with events in the time-series of the transformed waveform.

Synchronized Data-Acquisition Schedule

In embodiments, the data-acquisition schedule, which is the set of time points at which magnetic resonance data is to be sampled from a magnetic resonance detector, is synchronized with respect to the applied pulse or pulse train. FIGS. 4A-4C show three embodiments of this principle. In abstract, an interrogation protocol results when a transformed waveform is augmented with a data-acquisition schedule. By way of this interrogation protocol, the transformed waveform is applied to the sample with the goal of selectively exciting magnetic resonance from one or more components that may be present in a sample. FIG. 4A shows a series of data-acquisition points 410 that are scheduled beginning just after a time-reversed transformed waveform 412. In FIG. 4B, sets of data acquisition points 420 are shown interleaved into the gaps 422 between pulses 424 in a gated transformed waveform 426. In FIG. 4C, several series 430 of data acquisition points are shown, with each series following a pair of pulses 432. In this embodiment, the phase of the second pulse in each iteration of the pulse sequence is selected according to the phase $\phi_k$ of sequential points in the transformed source waveform 434. This embodiment may be appropriate in a protocol meant to construct a 2D or multidimensional NMR dataset in accordance with an embodiment of the present disclosure.

The data acquisition protocol appropriate to a 2D data set comprises the steps of:

A. Placing the sample in a static magnetic field
B. Obtaining a source waveform that is representative of a transient response function of a target substance that is suspected to exist in the sample
C. Exciting spin coherence in the sample, the exciting comprising:
  Constructing a pulse train comprising one or more shaped pulses by mathematically transforming said source waveform
  Augmenting said pulse train with a data-acquisition schedule that is synchronized with aid pulse train, and
  Applying the augmented pulse train to the sample
D. Detecting and recording one or more responses of the sample according to said data-acquisition schedule synchronized with said pulse train, and
E. Composing the one or more responses into a first magnetic resonance data set.

In embodiments, the first magnetic resonance data set composed in step E is one of a plurality of component data sets that are required to together constitute a larger data set. Each component data set is associated with parameters (such as time durations, pulse phases or amplitudes, the strengths or other characteristics of applied fields or other stimuli) which characterize the applied augmented pulse train for that data set.

Therefore, in 2D or multidimensional NMR applications, the steps above are supplemented with the following further steps:

F. Further transforming the said source waveform
G. Further modifying the said pulse train
H. Repeating steps (A-G) to obtain a plurality of responses And, finally, I. Composing the plurality of responses obtained at step H into a second magnetic resonance data set.

Further transforming the source waveform may involve applying one or more of a Fourier transformation; an inverse Fourier transformation; a time-reversal; complex conjugation; multiplication by an envelope function; replication of parts of said source waveform; formation of an echo; modulation in frequency; modulation in phase; and modulation in amplitude. Further modifying the pulse train may involve making one or more changes to the pulse train, including but not limited to adding pulses or delay intervals or modifying the phase of at least one pulse in the pulse train.

The data set generated in step (I) may be subject to further processing, for example Fourier transformation or correlation of component responses or data sets with corresponding parameters that characterize the "further modifying" in step G.

The term 2D (two-dimensional) is a term of art that refers to the fact that two indices may be required to index individual data elements (for example, complex numbers) within an overall data set. The present disclosure contemplates multidimensional data acquisition wherein the entire protocol is further repeated and supplemented with further transformation and modification of source waveforms and pulse trains and further composition of larger data sets in nested fashion for 3D, 4D, or higher dimensional applications.

Combination with Other Techniques Common to Pulsed NMR

In embodiments, using shaped pulses and pulse trains derived from a transient response function may be applied in combination with other standard techniques common in pulsed NMR, such as spin decoupling, gradient frequency- and phase-encoding, coherence selection using gradient pulses, phase cycling, spin echoes, perfect echoes, adiabatic pulses, frequency swept pulses, multiple quantum filters, double or multiple resonance, sample rotation, spin locking, purge pulses, or the like. Those skilled in the art will select methods appropriate for a given application.

The present invention will be more readily understood by referring to the following examples which are given to illustrate the invention rather than to limit its scope.

EXAMPLE

Industrial processes involving frequent chemical analysis are exposed to the challenge of efficiently and accurately analyzing samples containing more than one chemical component. In practice, mixture analysis by NMR may be complicated by overlap of spectral lines in unfavorable cases.

One way to mitigate the challenge of analyzing a mixture of chemical components by NMR is to use information that is known about one or more components in the mixture to selectively target the analysis of those one or more components when analyzing the mixture itself. More specifically, disclosed are methods that excite spin coherence in one chemical component of a mixture of chemical components without affecting the other chemical components, thus simplifying the NMR analysis process and the resulting data (i.e., the NMR spectrum).

By way of a non-limiting example, consider a mixture comprising chemical components A and B. In an embodiment of the present disclosure, a transient response function, such as a free-induction decay (FID), may be obtained by performing a first conventional (high field) or benchtop (low field) NMR analysis of a sample of component A. In this embodiment, the source waveform is the measured FID. This FID may then be transformed (modified) into a pulse sequence which is applied in a second high field or benchtop NMR analysis, to the mixture comprising chemical components A and B. That transformation may include a step in which the complex conjugate of the FID is time-reversed. The objective of applying this transformed pulse to the mixture is to selectively excite magnetic resonance from the nuclei in the molecules of chemical component A, despite A being mixed with B, and to obtain an NMR data output that is selectively informative of the characteristics (and for example the concentration) of chemical component A within the mixture. The chemical component A may be referred to as a target substance that may be suspected to exist in the mixture prior to performing the selective excitation. The NMR data output may comprise an NMR spectrum of component A.

Similarly, in a further embodiment of the present disclosure, a further FID may be obtained by performing a first NMR analysis of a sample of component B. The further FID may be transformed into a further pulse sequence which is applied, in a second NMR analysis, to the mixture comprising A and B. The objective in this case is to selectively excite the nuclei in the molecules of chemical component B, despite B being mixed with A, and to obtain a further NMR data output that is selectively informative of the characteristics of chemical component B within the mixture.

The process described with respect to a mixture comprising chemical components A and B may be further applied to a mixture comprising additional chemical components. In other embodiments, the source waveform may be captured differently as described herein (e.g., in the section of this disclosure entitled Waveform sources). In further embodiments, the source waveform may be transformed in a number of ways as described herein (e.g., in the section of this disclosure entitled Waveform transformations).

Figure 5:
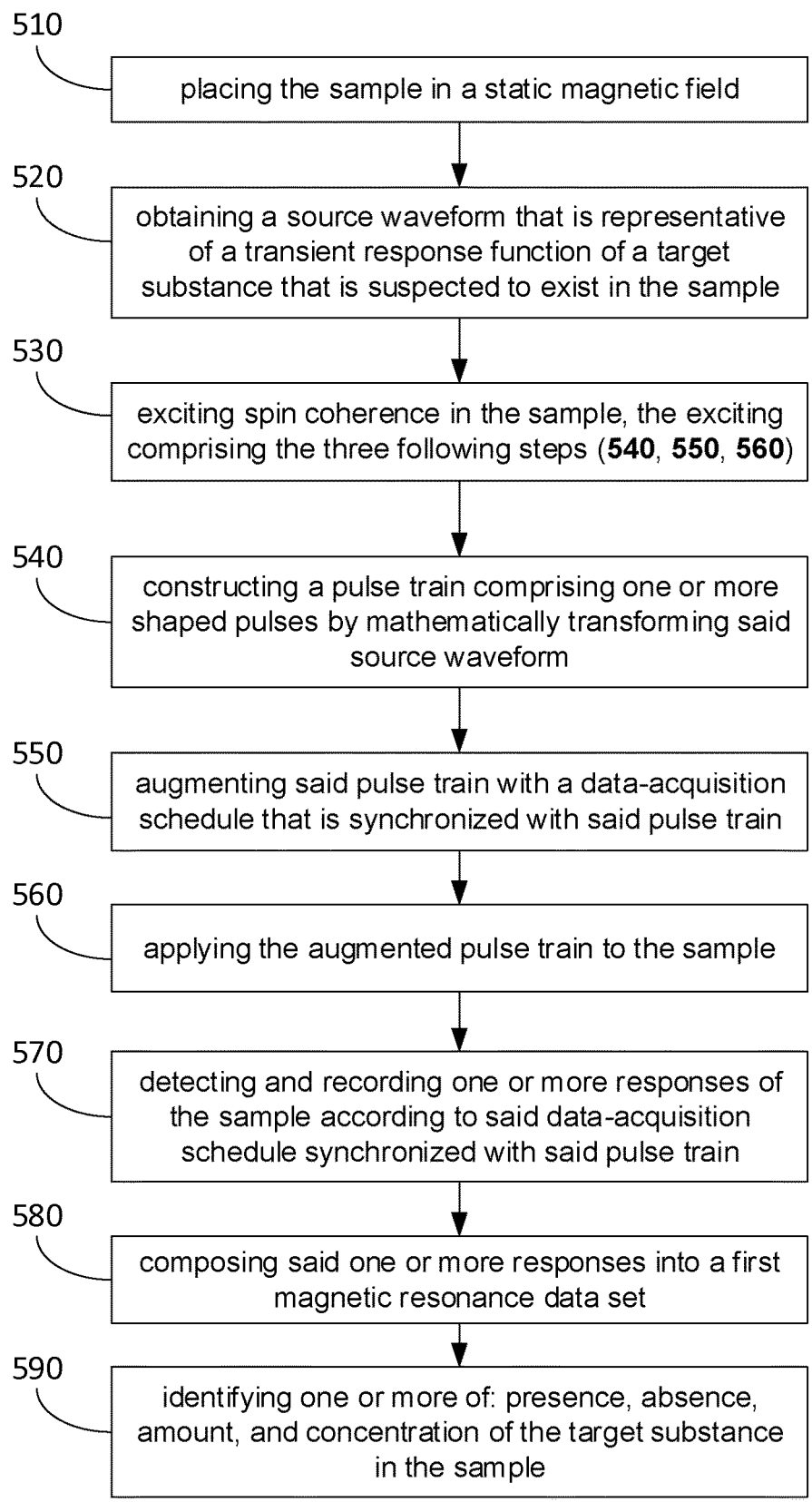
FIG. 5 illustrates a method of acquiring magnetic resonance data from a sample, in accordance with an embodiment.

FIG. 5 illustrates a method of acquiring magnetic resonance data from a sample, the method comprising the following steps:

Step 510 comprises placing the sample in a static magnetic field;

Step 520 comprises obtaining a source waveform that is representative of a transient response function of a target substance that is suspected to exist in the sample;

Step 530 comprises exciting spin coherence in the sample, the exciting comprising the three following steps (540, 550, 560).

Step 540 comprises constructing a pulse train comprising one or more shaped pulses by mathematically transforming said source waveform;

Step 550 comprises augmenting said pulse train with a data-acquisition schedule that is synchronized with said pulse train; and Step 560 comprises applying the augmented pulse train to the sample;

Step 570 comprises detecting and recording one or more responses of the sample according to said data-acquisition schedule synchronized with said pulse train;

Step 580 comprises composing said one or more responses into a first magnetic resonance data set;

Step 590 comprises identifying one or more of: presence, absence, amount, and concentration of the target substance in the sample.

Figure 6:
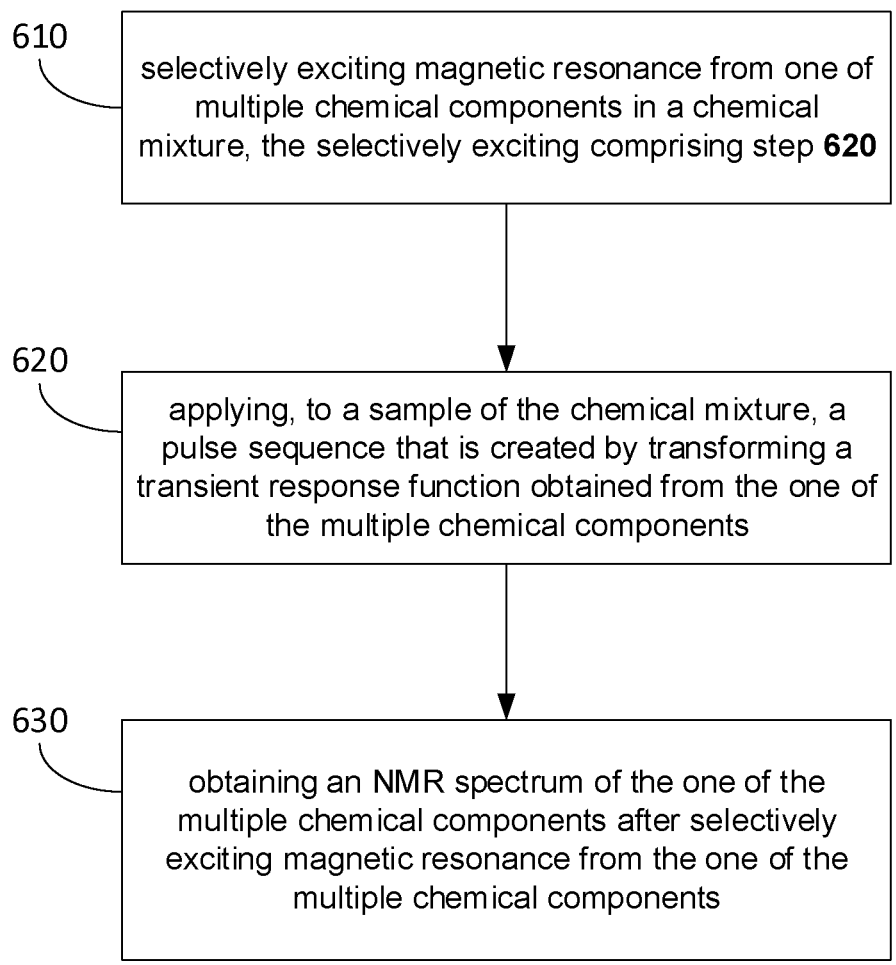
FIG. 6 illustrates a method of selectively exciting magnetic resonance from one of multiple chemical components in a chemical mixture, the selectively exciting comprising applying, to a sample of the chemical mixture, a pulse sequence that is created by transforming a transient response function obtained from the one of the multiple chemical components, in accordance with an embodiment.

FIG. 6 illustrates a method comprising the following steps:

Step 610 comprises selectively exciting magnetic resonance from one of multiple chemical components in a chemical mixture, the selectively exciting comprising step 620.

Step 620 comprises applying, to a sample of the chemical mixture, a pulse sequence that is created by transforming a transient response function obtained from the one of the multiple chemical components; and Step 630 comprises obtaining an NMR spectrum of the one of the multiple chemical components after selectively exciting magnetic resonance from the one of the multiple chemical components.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method of acquiring magnetic resonance data from a first sample, the method comprising:
   a. obtaining, from a source, a pre-stored source waveform associated with a second sample, the pre-stored source waveform being a time-reversed complex conjugate of a free induction decay, the free induction decay being representative of a transient response function of a target substance that exists in the second sample and is suspected to exist in the first sample;
   b. placing the first sample in a static magnetic field;
   c. exciting spin coherence in the first sample, the exciting comprising:
      constructing a pulse train comprising one or more shaped pulses by mathematically transforming said pre-stored source waveform;
      augmenting said pulse train with a data-acquisition schedule that is synchronized with said pulse train; and
      applying the augmented pulse train to the first sample;
   d. detecting and recording one or more responses of the first sample according to said data-acquisition schedule synchronized with said pulse train; and
   e. composing said one or more responses into a first magnetic resonance data set.

2. The method of claim 1 wherein said transient response function comprises one or more of: a free induction decay, a spin echo, a solid echo, a stimulated echo, a "perfect echo", and an adiabatic half passage.

3. The method of claim 1 further comprising identifying one or more of: presence, absence, amount, and concentration of the target substance in the first sample.

4. The method of claim 1 wherein said pre-stored source waveform is obtained by measuring a spectrum or a transient response function from the second sample using a magnetic resonance device.

5. The method of claim 1 wherein said pre-stored source waveform is obtained by a simulation.

6. The method of claim 1 wherein said pre-stored source waveform is obtained by lookup from within a spectral library.

7. The method of claim 1 wherein said mathematically transforming comprises one or more of:
   a Fourier transformation;
   an inverse Fourier transformation;
   a time-reversal;
   complex conjugation;
   multiplication by an envelope function;
   replication of parts of said pre-stored source waveform;
   formation of an echo;
   modulation in frequency;
   modulation in phase; and
   modulation in amplitude.

8. The method of claim 7 wherein said mathematically transforming further comprises adding a further transformed waveform to the pre-stored source waveform.

9. The method of claim 1 wherein said data-acquisition schedule comprises detection intervals interleaved between the pulses of said pulse train.

10. The method of claim 1 wherein said detecting follows said pulse train and said pulse train comprises a pulse which is a time-reversed or echoed version of the complex conjugate of said pre-stored source waveform.

11. The method of claim 1, further comprising composing a second magnetic resonance data set larger than the first magnetic resonance data set, wherein composing the second magnetic resonance data set comprises:
   f. further transforming the said pre-stored source waveform; or
   g. further modifying the said pulse train;
   h. repeating steps (a-g) to obtain a plurality of responses;
   i. composing the plurality of responses obtained at step (h) into the second magnetic resonance data set.

12. The method of claim 11, wherein step (g) comprises modifying the phase of at least one pulse in the pulse train.

13. The method of claim 1 wherein said first magnetic resonance data set comprises an NMR spectrum.

14. A device for implementing the method of claim 1.

15. The method of claim 1, wherein the target substance exists in the second sample in pure form or with impurities.

16. A method comprising:
   selectively exciting magnetic resonance from one of multiple chemical components in a chemical mixture, the selectively exciting comprising applying, to a first sample of the chemical mixture, a pulse sequence comprising one or more shaped pulses that are created by mathematically transforming a pre-stored source waveform associated with a second sample, the pre-stored source waveform being a time-reversed complex conjugate of a free induction decay, the free induction decay being representative of a transient response function of a target substance that exists in the second sample and is suspected to exist in the first sample.

17. The method of claim 16 wherein the transient response function comprises one or more of: a free induction decay (FID), a spin echo, a solid echo, a stimulated echo, a "perfect echo," and an adiabatic half passage.

18. The method of claim 16 further comprising obtaining an NMR spectrum of the one of the multiple chemical components after selectively exciting magnetic resonance from the one of the multiple chemical components.

19. A device for acquiring magnetic resonance data, the device comprising:
   a main field magnet system for producing a static magnetic field, the magnet system at least partially enclosing a first sample region shaped and dimensioned to receive a first sample therein;
   a coil for delivering a pulsed magnetic field to the first sample and for receiving the response of the first sample to the pulsed magnetic field; and
   control circuitry operably connected to the coil for controlling the pulsed magnetic field and detecting and recording the response of the first sample to the pulsed magnetic field;
   the control circuitry being adapted to:
      obtain, from a source, a pre-stored source waveform associated with a second sample, the source waveform being a time-reversed complex conjugate of a free induction decay, the free induction decay being representative of a transient response function of a target substance that exists in the second sample and is suspected to exist in the first sample;
      excite spin coherence in the first sample, the exciting comprising:
         constructing a pulse train comprising one or more shaped pulses by mathematically transforming said pre-stored source waveform;
         augmenting said pulse train with a data-acquisition schedule that is synchronized with said pulse train; and
         applying the augmented pulse train to the first sample;
      detect and record one or more responses of the first sample according to said data-acquisition schedule synchronized with said pulse train; and
      compose said one or more responses into a first magnetic resonance data set.

20. The device of claim 19, wherein the transient response function comprises one or more of: a free induction decay (FID), a spin echo, a solid echo, a stimulated echo, a "perfect echo," and an adiabatic half passage.

21. The device of claim 19 wherein the device is further adapted to identify one or more of: presence, absence, amount, and concentration of the target substance in the first sample.

* * * * *